United States Patent
Thill et al.

(10) Patent No.: US 8,602,314 B2
(45) Date of Patent: Dec. 10, 2013

(54) MEMORY CARD ADAPTER

(75) Inventors: Michel Thill, Meudon (FR);
Francois-Xavier Marseille, Meudon (FR)

(73) Assignee: Gemalto SA, Meudon (FR)

( * ) Notice: Subject to any disclaimer, the term of this patent is extended or adjusted under 35 U.S.C. 154(b) by 92 days.

(21) Appl. No.: 13/001,387

(22) PCT Filed: Jul. 1, 2009

(86) PCT No.: PCT/EP2009/058286
§ 371 (c)(1),
(2), (4) Date: May 2, 2011

(87) PCT Pub. No.: WO2010/000785
PCT Pub. Date: Jan. 7, 2010

(65) Prior Publication Data
US 2011/0201233 A1     Aug. 18, 2011

(30) Foreign Application Priority Data

Jul. 4, 2008  (EP) ..................................... 08290660

(51) Int. Cl.
*G06K 19/06* (2006.01)
(52) U.S. Cl.
USPC ....................................................... 235/492
(58) Field of Classification Search
USPC ................................ 235/492, 380
See application file for complete search history.

(56) References Cited

U.S. PATENT DOCUMENTS

| | | |
|---|---|---|
| 5,936,226 A | 8/1999 | Aucsmith |
| 7,172,463 B2 * | 2/2007 | Inaba ............................ 439/630 |
| 2006/0164891 A1 | 7/2006 | Mills et al. |
| 2007/0001017 A1 * | 1/2007 | Nuri et al. ...................... 235/492 |
| 2007/0132733 A1 * | 6/2007 | Ram ............................. 345/163 |
| 2009/0236416 A1 * | 9/2009 | Morita .......................... 235/380 |

FOREIGN PATENT DOCUMENTS

| | | |
|---|---|---|
| JP | 2003248797 A | 5/2003 |
| WO | WO02/05102 A | 1/2002 |
| WO | WO2005066745 A1 | 7/2005 |

OTHER PUBLICATIONS

PCT/EP2009/058286, International Search Report, Oct. 19, 2009, European Patent Office, P.B. 5818 Patentlaan 2 NL—2280 HV Rijswijk.

PCT/EP2009/058286, Written Opinion of the International Searching Authority, Oct. 19, 2009, European Patent Office, D-80298 Munich.

* cited by examiner

*Primary Examiner* — Seung Lee
(74) *Attorney, Agent, or Firm* — The Jansson Firm; Pehr B. Jansson

(57) ABSTRACT

An adapter device for connecting a memory card to a host. The adapter having a primary connector to be connected with the host taking up the adapter device and a secondary connector to take up the memory card. An interrupter of the adapter is connected to the primary connector and to the secondary connector. A device interface circuit connected to the primary connector controls the opening and closing of the interrupter depending on the commands received by the first connector, wherein the device interface circuit is configured so that if the primary connector receives a command from the host that is not related to the memory card, the device interface circuit opens the interrupter after the command has passed.

18 Claims, 1 Drawing Sheet

MEMORY CARD ADAPTER

BACKGROUND

The invention refers to an adapter for memory cards. More precisely, it refers to an adapter allowing to connect a second device to a memory card port in addition to a memory card.

The market for memory cards has grown significantly based on the possibility of storing large amounts of data on Flash cards. There are different standards for such memory cards, for instance the SD standard (Secure Digital). Like all standards for memory cards, the SD standard defines a card format, a connector type and a protocol of communication between the host device designed to take up the SD card, as well as the card itself. The SD standard as used in this document refers to publications of the SD Card Association, including specifications of "SD memory card, Physical layer specification", "SDHC memory card", "miniSD card", "microSD card", "SDIO card" and "SD host controller specification". Furthermore, certain memory card standards use an extended communication protocol which allows to use additional instructions for using different devices than memory cards. In particular, the SD standard includes an extended command set called SDIO (Secure Digital Input Output device). With this SDIO extension, one can connect different input/output devices to the host.

Within the realm of SD, it is common to use SDIO type cards to allow other services than just data storage. This is also known as SD-MCE (Secure Digital-Mobile Commerce Extension). With this card, one can implement other services than just memory storage, for instance pay TV, on mobile devices such as mobile phones or portable computers.

However, mobile devices usually only have one such memory card port, and a second port for such devices is not expected in the future. This means that a user who wants to use pay TV on their phone cannot use a memory card at the same time. Changing the cards as needed is not a good solution because the memory card is not available while the TV function is being used. Users might want to store data while using the TV function. The SD standard is not designed to allow the parallel connection of two devices at one single port at the same time.

The invention consists of an adapter allowing to connect two electronic devices at the same port, at the same time. Thus the host device communicates with one single device, allowing to implement an electronic function on one side while using the storage device on the other side. More generally, the invention constitutes a solution to actuate two devices at one single port which originally allows the connection of only one device.

This means that the invention is an adapter including a primary connector, a secondary connector, an interrupter and a device interface circuit. The primary connector is connected with the host taking up said adapter device. The second connector is taking up a memory card. The interrupter links the primary connector and the secondary connector. The device interface circuit is connected to the primary connector and controls the opening or closing of the interrupter depending on the commands received by the first connector.

The invention preferably includes an application circuit connected to the device interface circuit. The adapter includes a host interface circuit connected to the secondary connector for communication with the memory card. The device interface circuit and the host interface circuit are interconnected to exchange data and determine common features while taking the features of the card and the own features of the device into account.

In accordance with a special way of carrying out the invention, the device interface circuit closes the interrupter when a command is received by the primary connector and keeps it closed to let the response from the card pass if the command is directed toward the card. If no card is connected, the device interface circuit reacts to all commands. The device interface circuit closes the interrupter when a command is received by the first connector and opens the interrupter to block the response from the card if the command is directed toward the application circuit.

BRIEF DESCRIPTION OF THE DRAWINGS

The invention is described in more detail by the following description, which describes further advantages and special features and makes reference to the annexed figures, including.

DETAILED DESCRIPTION

Figure 1:
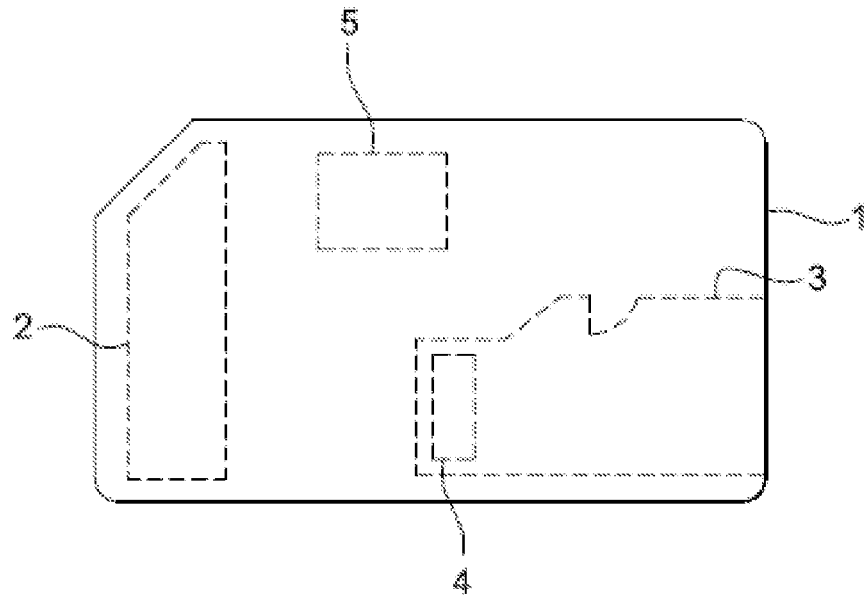
FIG. 1, presenting a preferred way of carrying out the invention of an adapter in SD card format, FIG. 2 representing a functional diagram of the invention.

FIG. 1 displays a preferred way of carrying out an adapter according to the invention. Adapter 1 is realised here in SD memory card format. Adapter 1 includes a primary connector 2 in the format of an SD card connector. Adapter one includes a device to take up a memory card 3 in microSD format, connected via a secondary connector 4. Adapter 1 includes a chip 5 connected to the primary and the secondary connector 2 and 4. The chip 5 includes the electronic circuitry of adapter 1. In the preferred way of FIG. 1, the electronic circuitry of adapter 1 is all placed on one single chip, yet it is also possible to distribute the circuitry over several chips.

Figure 2:
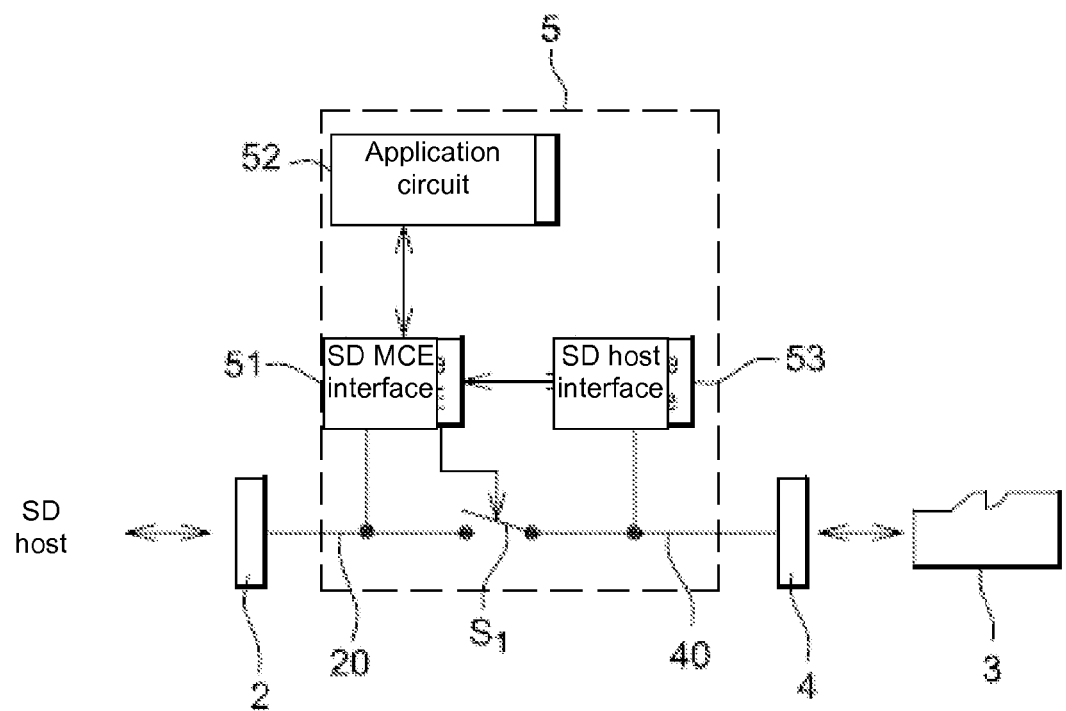

FIG. 2 provides a functional description of the electronic circuits on the chip 5. The primary connector 2 and the secondary connector 4 are connected on the chip, respectively, by a primary bus 20 and a secondary bus 40 containing as many connectors as there are contacts for an SD card. For reasons of clarity, one single wire is depicted.

The primary bus and the secondary bus are interconnected by a primary interrupter S1 consisting of interrupters allowing to connect or disconnect each conductor of the buses 20 and 40. The interrupter S1 thus allows to establish a direct connection between the two connectors 2 and 4, or to disconnect them from each other.

A device interface circuit 51 is connected to the primary bus 20. The device interface circuit 51 is a circuit designed to communicate with a host connected to the primary connector 2. The user interface circuit provides protocol and communication control for an application circuit 52. The application circuit 52 can be of any type, for instance a pay TV control circuit of the SD-MCE type. Other application circuits are possible; circuit 52 can be a modem with another connection, a card reader according to the ISO7816 standard, or any other application that can be connected via an SD bus.

The device interface circuit 51 analyses all commands exchanged at the level of the primary connector 2. However, this interface circuit does not react to all commands. In fact, certain commands are processed directly by the card 3. The interface circuit is furthermore connected to the interrupter S1 to control the same and determine if the card responds directly or not, depending on the commands observed.

A host interface circuit 53 is connected on one side to the secondary bus 40 and on the other side to the device interface circuit 51. The host interface circuit 53 allows to control the card 3 if the interrupter S1 is open. The connection between the host interface circuit 53 is linked to the device interface circuit 51 to be able to integrate data coming from the card 3 into data returned by the device interface circuit 51.

At the start, the adapter 1 contacts the host, which accepts it as a single device integrating the features of the application circuit 53 and the features of the card 3 at the same time. During this start-up phase, the same principle as detailed above is realised, but certain commands sent by the host device to the card should also be anticipated.

The following table lists the exchange of commands and responses during the start and initialisation phase in chronological order. The commands and responses listed in the table, as well as the device flags, are defined in the SD standard, which can be consulted for more detailed information.

used in a device flag of the device interface 51, the host interface circuit 53 intercepts the response and transmits the data to the device interface circuit 51 for the storage of the respective data.

If the command received is not a command that is exclusively related to the card 3, the interrupter S1 is opened as soon as the command has passed completely. The host interface circuit receives the possible response from the card 3. The device interface circuit 51 responds, possibly while taking the response from the card 3 into account. When the device interface circuit 51 has finished its response, it closes the interrupter S1 again so that the card can receive the next command.

| Command sent by SD Host | Response from interface 51 | Processing by interfaces 51 and 53 | State of S1 | Command sent by interface 53 | Response by card 3 |
|---|---|---|---|---|---|
| Cmd0 | | | Closed | | |
| Cmd8 | | | Closed | | |
| | | | Closed | | R7 |
| Acmd41 | | | Closed | | |
| | Busy | Storage of response data of card 3 in the OCR flag of interface 51 | Open | | OCR |
| Acmd41 | | | Open | Cmd2 | |
| | Busy | Storage of response data of card 3 in the CID flag of interface 51 | Open | | CID |
| Acmd41 | | | Open | | |
| | OCR | | Open | | |
| Cmd2 | | | Open | | |
| | CID | | Open | | |
| Cmd3 | | | Closed | | |
| | | | Closed | | RCA |
| Cmd9 | | | Closed | | |
| | | Storage of the data of the CSD response for communication with card 3 and the functions of the application circuit 52 | Closed | | CSD |
| Cmd4 | | Update DSR flag in interface 51 | Closed | | Update DSR |

It should be noted that the information in the CDS and OCR flags of the device interface circuit 51 is linked intelligently: The Vdd is selected to correspond at the same time to the card 3 and the adapter 1, the maximum currents are added up and the transmission rates are determined depending on the slowest one between the device interface circuit 51 etc. The CSD and OCR flags are rebuilt to show features that are compatible with the card 3 and the adapter 1 at the same time.

For the CID flag, adding up the data is also recommended. The manufacturer of the adapter and of the card are not the same. Furthermore, the card 3 can be removed from the adapter and the ID data is not the same depending on the card being present or not.

As far as the content of the RCA flag is concerned, the adapter has to store this information since the address provided by the card can also be used to actuate the application circuit.

At the end of the start phase, the commutation circuit 54 detects the command Cmd4 on the bus 20 and keeps the interrupter S1 closed. Thus, if the SD hosts sends read or write commands or other commands solely to the destination of the card 3, these commands are received respectively by the card 3 and the interface circuit 51 does not respond and keeps the interrupter S1 closed so that the card responds directly. Finally, if the response refers to a state of the card that can be If the SD host wants to send one or several commands to the application circuit 52, it must use an extended command set. For this purpose, it sends a command, for instance Cmd6, which is not supported by the card 3. When the commutation circuit 54 detects this command Cmd6, it opens the interrupter S1. The card 3, having received the command Cmd6, may respond that it does not support that command but its response is not transmitted to the SD host. The response is given by the interface circuit 51, then the interrupter S1 is closed again so that the card can receive the next command intended for it.

If the power supply is cut off, the adapter will re-initiate the start phase.

It is also possible to use the adapter without the card 3. In such a case, the card never responds to the command sent to it during the start phase. In relation to the table above, this corresponds to the response to the commands Cmd8 and Acmd41 missing. The response to the command Cmd8 is optional and therefore does not mean that there is no card. In contrast, the failure to provide OCR response within a predetermined time means that there is no card 3 and that therefore the device interface 51 can respond with its own OCR flag immediately after the previous command Acmd41.

In one variant option, it is possible that the application circuit 52 needs to store information on the card 3. In such a case, the proper reaction would be to open the interrupter S1 and address the card 3 with the help of the host interface 53. If the SD host sends a command to the card while the card 3 is being used, the device interface circuit will respond that the card is not available with the response "busy".

The example described above refers to an adapter in SD card format taking up a micro SD card. It is possible to modify these format aspects. A card in the SDIO format can have a part that is larger than an SD card and it is possible to replace the microSD card 3 with any other SD or miniSD card format.

As mentioned earlier, the application circuit 52 can also be of any type supported by the SDIO standard, and the application circuit 52 may have a connection to another external circuit.

In this preferred way to carry out the invention, the chip 5 corresponds to several electronic circuits implemented on one single chip. Naturally, the electronic circuits can also be realised on separate chips, depending on the type of application realised with the adapter.

The problem outlined here, as well as the preferred way to carry out the invention, refer to the SD standard. Nevertheless, there are other, similar, memory card standards with similar features to the SD standard, for which the same problem arises and for which a corresponding solution can be applied. If the card standard allows communication with something other than a memory card and the communication protocol allows communication only with one single device, an adapter of the same type can be used. Other commands suitable for the standard used would have to be applied in such a case.

The invention claimed is:

1. An adapter device (1) for connecting a memory card to a host, comprising:
   a primary connector (2) to be connected with the host taking up said adapter device,
   a secondary connector (4) to take up the memory card (3),
   an interrupter (S1) connected to the primary connector and to the secondary connector,
   a device interface circuit (51) connected to the primary connector and controlling the opening and closing of the interrupter (S1) depending on the commands received by the first connector, wherein the device interface circuit (51) is configured so that if the primary connector (2) receives a command from the host that is not related to the memory card (3), the device interface circuit (51) opens the interrupter (S1) after the command has passed.

2. The adapter device according to claim 1, including furthermore an application circuit (52) connected to the device interface circuit (51).

3. The adapter device according to claim 1 or 2, including furthermore a host interface circuit (53) connected to the secondary connector (4) to communicate with the memory card (3).

4. The adapter device according to claim 3, whereby the device interface circuit (51) and the host interface circuit (53) are interconnected to exchange data and determine common features while taking the features of the card (3) and the own features of the device into account.

5. The adapter device according to claim 1, whereby the primary connector and the secondary connector comply with the SD card standard.

6. The adapter device according to claim 5, whereby the adapter device has the SD standard format and the memory card has the microSD format.

7. The adapter device according to claim 1, whereby the device interface circuit (51) closes the interrupter (3) when a command is received by the primary connector (2) and keeps it closed to let the response from the card (3) pass if the command is directed toward the card.

8. The adapter device according to claim 7, whereby, if no card (3) is connected, the device interface circuit reacts to all commands.

9. The adapter device according to claim 2, whereby the device interface circuit (51) closes the interrupter (3) when a command is received by the primary connector (2) and opens the interrupter to block the response from the card (3) if the command is directed toward the application circuit (52).

10. An adapter device (1) for connecting a memory card to a host comprising:
    a primary connector (2) to be connected with the host taking up said adapter device,
    a secondary connector (4) to take up the memory card (3),
    an interrupter (S1) connected to the primary connector and to the secondary connector,
    a device interface circuit (51) connected to the primary connector and controlling the opening and closing of the interrupter (S1) depending on the commands received by the first connector,
    wherein the device interface circuit (51) is configured to close the interrupter when a command is received by the primary connector (2) and is configured to open the interrupter (S1) to block the response from the memory card if the command is not directed to the memory card.

11. The adapter device according to claim 10, including furthermore an application circuit (52) connected to the device interface circuit (51).

12. The adapter device according to claim 10 or 11, including furthermore a host interface circuit (53) connected to the secondary connector (4) to communicate with the memory card (3).

13. The adapter device according to claim 12, whereby the device interface circuit (51) and the host interface circuit (53) are interconnected to exchange data and determine common features while taking the features of the card (3) and the own features of the device into account.

14. The adapter device according to claim 11, whereby the device interface circuit (51) closes the interrupter (3) when a command is received by the primary connector (2) and opens the interrupter to block the response from the card (3) if the command is directed toward the application circuit (52).

15. The adapter device according to claim 10, whereby the primary connector and the secondary connector comply with the SD card standard.

16. The adapter device according to claim 15, whereby the adapter device has the SD standard format and the memory card has the microSD format.

17. The adapter device according to claim 10, whereby the device interface circuit (51) closes the interrupter (3) when a command is received by the primary connector (2) and keeps it closed to let the response from the card (3) pass if the command is directed toward the card.

18. The adapter device according to claim 17, whereby, if no card (3) is connected, the device interface circuit reacts to all commands.

* * * * *